US006864582B1

United States Patent
Vashchenko et al.

(10) Patent No.: US 6,864,582 B1
(45) Date of Patent: Mar. 8, 2005

(54) SEMICONDUCTOR INTERCONNECT AND METHOD OF PROVIDING INTERCONNECT USING A CONTACT REGION

(75) Inventors: Vladislav Vashchenko, Palo Alto, CA (US); Peter J. Hopper, San Jose, CA (US); Philipp Lindorfer, San Jose, CA (US); Andy Strachan, Santa Clara, CA (US); Peter Johnson, Sunnyvale, CA (US)

(73) Assignee: National Semiconductor Corp., Santa Clara, CA (US)

( * ) Notice: Subject to any disclaimer, the term of this patent is extended or adjusted under 35 U.S.C. 154(b) by 79 days.

(21) Appl. No.: 10/284,761

(22) Filed: Oct. 31, 2002

(51) Int. Cl.[7] .................................. H01L 29/72
(52) U.S. Cl. .................. 257/758; 257/350; 257/410
(58) Field of Search ........................ 257/350, 410, 257/758; 438/279, 289, 303

(56) References Cited

U.S. PATENT DOCUMENTS

2002/0179970 A1 * 12/2002 Yagishita et al. .......... 257/350

\* cited by examiner

*Primary Examiner*—Edward Wojciechowicz
(74) *Attorney, Agent, or Firm*—Jurgen Vollrath

(57) ABSTRACT

In a semiconductor structure, interconnects between regions of a single device or different devices are achieved by forming contacts or plugs in thick oxide holes that span across the regions to be interconnected.

4 Claims, 3 Drawing Sheets

SEMICONDUCTOR INTERCONNECT AND METHOD OF PROVIDING INTERCONNECT USING A CONTACT REGION

FIELD OF THE INVENTION

The invention relates to the field of semiconductors. In particular, the invention relates to electrical interconnects and a method for providing electrical interconnects between regions in a semiconductor device.

BACKGROUND OF THE INVENTION

In the manufacture of semiconductor chips, cost is clearly an important concern. Ways are therefore always being looked for to reduce the size of devices in order to allow more devices to fit onto a semiconductor wafer. Also, speed considerations dictate strongly in favor of reduced size. Furthermore, cost is directly impacted by process considerations: especially the number of process steps involved in producing a particular circuit in semiconductor chip form.

Typically, semiconductor devices are built up in layers involving a series of process steps to produce the desired characteristics. For example, a typical semiconductor device such as the device 100 illustrated in FIG. 1, may include a polysilicon gate 110 insulated from the underlying silicon substrate by an oxide layer 112. Two n+ composite regions 114, 116 are shown and may comprise drain and source regions of a NMOS transistor. The device 100 is separated by shallow trench isolation regions 118, 120 from adjacent devices 130, 140, respectively. As mentioned above, the devices 100, 130, 140 are formed in layers. Typically, a silicon substrate is used in which the composite regions 114, 116 are formed by introducing impurities using one of several possible methods. The shallow trench isolation regions 118, 120 are formed as isolators between the devices. Thereafter a silicide layer 150 may be formed by depositing a layer of metallic material such as cobalt or titanium and annealing it to react with the silicon to form a silicide. Thereafter the excess, unreacted cobalt or titanium is removed using an etch process. This is followed by depositing a thick oxide layer (TEOS) 152. In order to provide electrical contacts to specific regions in the device, holes are etched into the TEOS 152 using masking and etching steps, whereafter the holes are filled with metal such as tungsten to define tungsten contacts or plugs 160, 162. A metal layer (metal 1) 170 is then formed on top of the TEOS 152 to contact the contacts 160, 162. In order, for example, to interconnect the polysilicon gate 110 and the composite material 180 of adjacent device 140, contacts 182, 184 are provided to the polysilicon gate 110 and composite 180, respectively, as shown in the plan view of FIG. 2. The metal 1 layer 170 is formed to provide a metal interconnect between the contact 182 and contact 184.

It will be appreciated that the formation of the interconnect between the polysilicon gate 110 and composite 180 involves quite a number of steps and is space consuming due to the need to build the vertical contacts 182, 184 and the array of metal traces of the metal 1 layer 170. The present invention seeks to provide a simpler, more cost effective, and more compact solution for interconnecting regions in a semiconductor device, without requiring extra process steps.

SUMMARY OF THE INVENTION

The present invention provides for electrically interconnecting regions in a semiconductor structure, either within a device or between devices.

According to the invention, there is provided a method of providing an interconnect between a first region and a second region of a semiconductor device, comprising as part of the process of forming metal contacts, forming a metal contact that spans across the regions to be interconnected. Forming the metal contact may include forming a hole in a thick oxide layer, positioned to span across the regions to be interconnected, and depositing a metal in the hole. Preferably the contact is formed as part of the process steps of forming other metal contacts to predetermined regions of the structure. The metal may, for example, be tungsten.

Further, according to the invention, there is provided a method of forming an interconnect between two regions in a semiconductor structure, comprising forming a silicide layer over at least part of the structure, forming an oxide layer over the structure, forming holes in the oxide layer to provide access to defined regions in the structure, at least partly filling the holes with metal material, wherein at least one of the holes spans across two or more regions. The two or more regions spanned by at least one of the holes may be two composite regions or a composite region and a polysilicon region of the same or different devices. For example the regions may be a polysilicon gate of one device, and a n+ or p+ composite region of a different device on the structure. The metal material may be aluminum or tungsten.

Still further, according to the invention, there is provided a CMOS structure having a polysilicon gate connected to a composite region by means of a single metal plug directly contacting the gate polysilicon and composite region. The metal plug may be an aluminum or tungsten plug and may be covered by a dummy metal layer. The polysilicon gate and composite region may form part of the same device or different devices.

Still further, according to the invention, there is provided a CMOS structure having at least two composite regions interconnected by means of a single metal plug directly contacting the at least two composite regions. The metal plug may be an aluminum or tungsten plug, and may be covered by a dummy metal layer. The composite regions may form part of the same device or different devices.

Still further, according to the invention, there is provide a semiconductor device comprising a polysilicon gate, a n+ composite defining a source region, a n+ composite defining a drain region, and a plurality of polysilicon drain regions extending between a drain contact and the drain region, wherein at least one of the polysilicon drain regions is connected to the n+ drain composite by a metal plug.

More than one polysilicon drain region may be connected to the n+ drain composite by means of one or more metal plugs. The metal plugs may be tungsten or aluminum plugs and may be covered by a dummy metal layer.

DETAILED DESCRIPTION OF THE INVENTION

Figure 1:
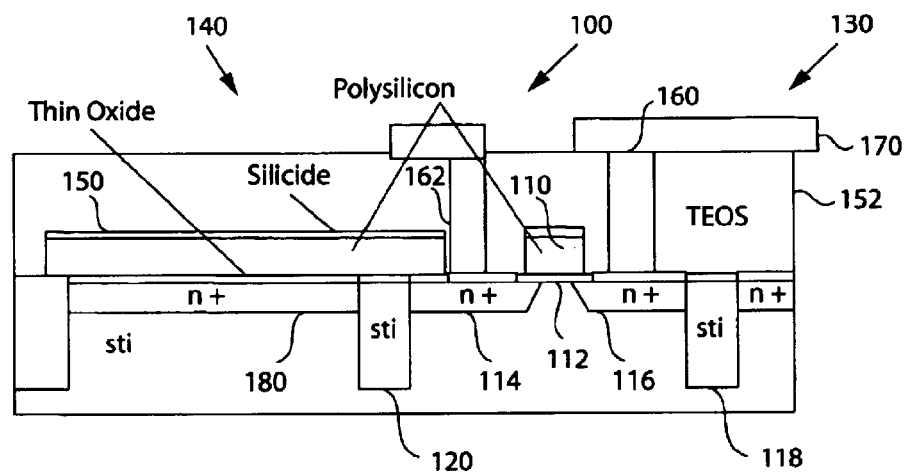
FIG. 1 is a sectional view through a prior art semiconductor structure.
Figure 2:
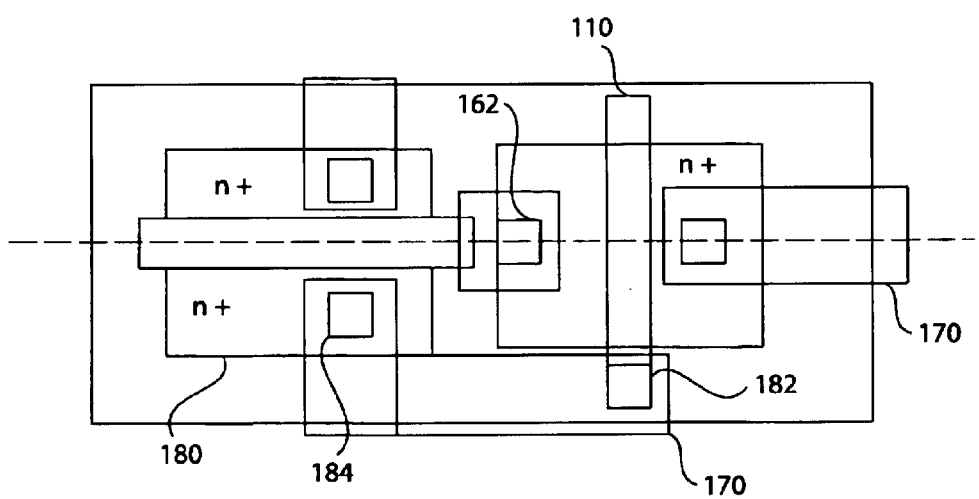
FIG. 2 is a partially transparent plan view not to scale of the structure of FIG. 1.
Figure 3:
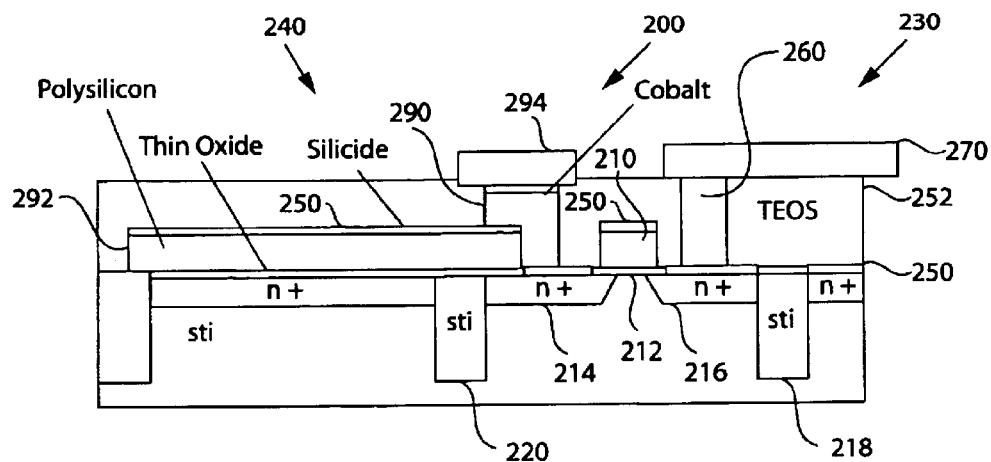
FIG. 3 is a sectional view through one embodiment of a semiconductor structure of the invention.
Figure 4:
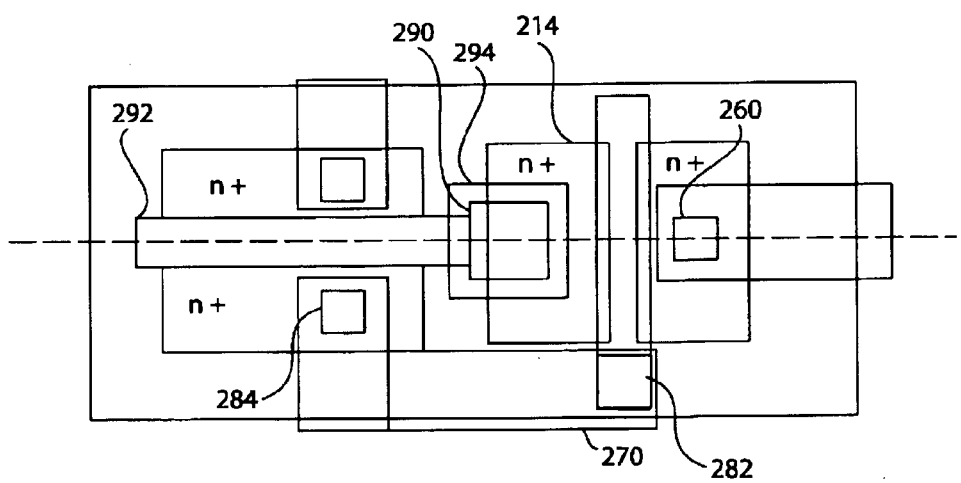
FIG. 4 is a partially transparent plan view not to scale of the structure of FIG. 3.

One embodiment of a semiconductor structure making use of an interconnect in accordance with the invention is shown in FIGS. 3 and 4. Much of the structure is the same as in the prior art structure of FIGS. 1 and 2. For instance, the structure of the embodiment of FIGS. 3 and 4 includes a device 200 having a polysilicon gate 210 insulated from the underlying silicon substrate by an oxide layer 212. Two n+ composite regions 214, 216 are shown and could, for instance, comprise drain and source regions of a NMOS transistor. The device 200 is separated by shallow trench isolation regions 218, 220 from adjacent devices 230, 240, respectively. In accordance with typical process steps, the devices 200, 230, 240 are formed in layers. Initially, a silicon substrate is used in which the composite regions 214, 216 are formed by introducing impurities using one of several possible methods. The shallow trench isolation regions 218, 220 are formed as isolators between the devices 200 and 230, and between 200 and 240. Thereafter a silicide layer 250 is formed by depositing a layer of metallic material such as cobalt or titanium and annealing it to react with the silicon to form a silicide. Thereafter the excess, unreacted cobalt or titanium is removed using an etch process, leaving behind a silicide layer 250. This is followed by depositing a thick oxide layer (TEOS) 252. In order to provide electrical contacts to specific regions in the device, a prior art approach could be used in which, after chemical mechanical polishing (CMP) of the TEOS 252, holes are etched into the TEOS 252 using masking and etching steps, whereafter the holes are filled with metal such as tungsten to define tungsten contacts or plugs as shown for the plugs 260, 282, 284. A metal layer (metal 1) 270 is then formed on top of the TEOS 252 to contact the contacts, such as contacts 260, 282, 284.

The present invention, however, introduces an alternative approach to providing an electrical interconnect between two regions of the structure, as is also shown in FIGS. 3 and 4. A plug or contact 290 is formed spanning two regions. In this case contact 290 spans the polysilicon region 292 of device 240, and composite region 214 of device 200. In this way it forms an interconnect between the composite of device 240 and the composite of device 200, using a single metal plug 290. As is evident from FIGS. 3 and 4, the plug 290 contacts the n+ composite 214 via the silicide layer 250.

Typically, in order to avoid adding unnecessary process steps, the plug or contact 290 is formed using existing process steps. Thus, for instance, in the present embodiment, the plug 290 was formed by etching a hole in the thick metal oxide layer (TEOS) 252 to span over the region of the polysilicon gate 292 and composite region 214 as subsequently occupied by the plug 290, during the same time as the holes for the other contacts are formed (e.g. holes for contacts 260, 282, 284). All of the holes intended as contacts or plugs, were then filled to form not only the contacts 260, 282, 284, but also the plug 290. The plug 290, however, distinguishes itself that it does not have to contact a metal layer such as metal 1 layer 270. However, retaining a metal region (from the metal 1 layer) above the plug 290, as indicated by reference numeral 294, has been found to shield the plug 290 below it. In this embodiment, the plug 290 is formed from tungsten, but it will be appreciated that other metals commonly used, such as aluminum, could also be used.

While the present embodiment specifically showed the interconnection between a polysilicon region of one device and a composite region of another device, it will be appreciated that this was shown by way of example only and that other embodiments and implementations of the invention are possible. For instance, interconnects in accordance with the invention can also be made between regions on a single device. Also, interconnects in accordance with the invention can be made between two composite regions on the same device or different devices. Also, while the embodiment illustrated in FIGS. 3 and 4 showed a CMOS device, the invention could be used to provide interconnects between regions of other devices, e.g., BJT devices.

Figure 5:
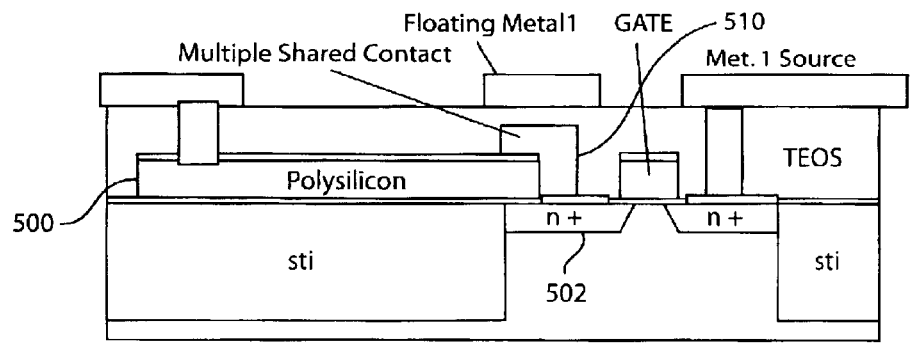
FIG. 5 is a sectional view through another embodiment of a semiconductor structure of the invention.
Figure 6:
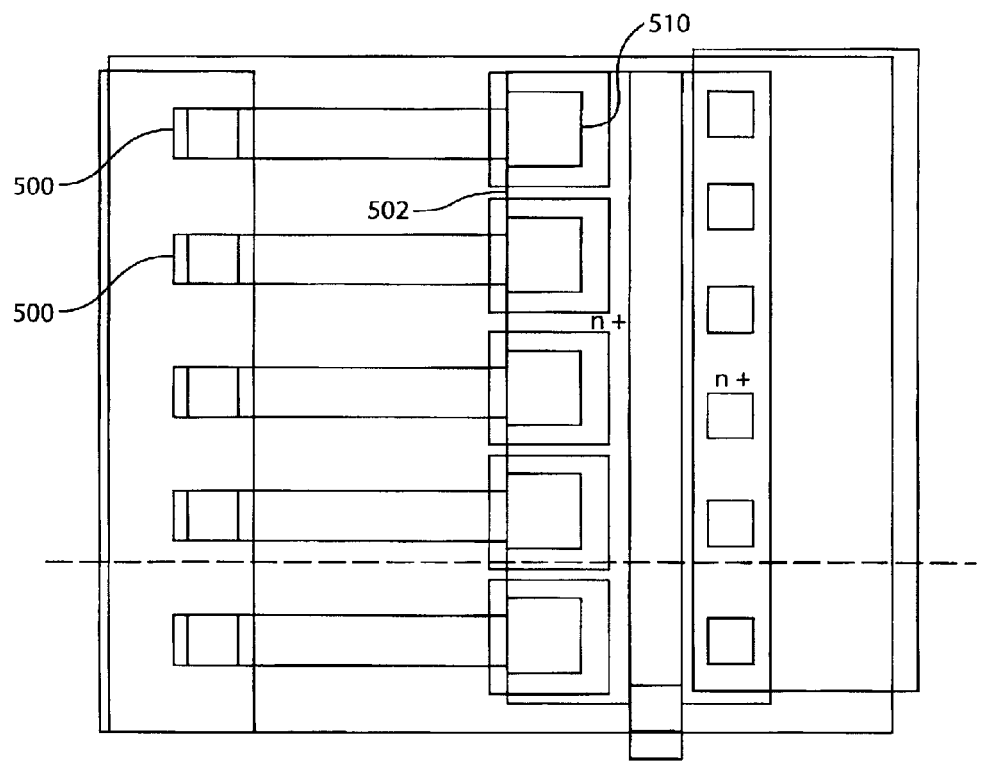
FIG. 6 is a partially transparent plan view not to scale of the structure of FIG. 5.

Another implementation of the invention is shown in FIGS. 5 and 6. This embodiment shows an ESD protection device having a low capacitance ballasing region as proposed in an ESD/EOS Symposium 2001 paper (pages 1–11) entitled "Multi-finger Turn-on Circuits and Design Techniques for Enhanced ESD Performance and Width-scaling" by Sarnoff Corporation. The present invention can be implemented in a Sarnoff-like structure as shown in FIGS. 5 and 6, in which the polysilicon fingers 500 are connected to the n+ composite region 502 by means of plugs or contacts 510 in accordance with the invention.

The present invention thus provides a simpler, more cost effective, and more compact solution for interconnecting regions in a semiconductor device, by sharing a contact region or plug between two regions, and, at the same time, avoiding extra process steps.

It will be appreciated that, while the invention was described above with respect to specific embodiments, the claimed invention can be realized using other configurations, without departing from the scope of the invention. For instance, although the invention was described for CMOS embodiments, it is applicable also to other semiconductor structures such as BJTs.

What is claimed is:

1. A semiconductor device, comprising
   a polysilicon gate,
   a n+ composite defining a source region,
   a n+ composite defining a drain region, and
   a plurality of polysilicon drain regions extending between a drain contact and the drain region, wherein at least one of the polysilicon drain regions is connected to the n+ drain composite by a metal plug.

2. A device of claim 1, wherein more than one polysilicon drain region is connected to the n+ drain composite by means of one or more metal 3. A device of claim 2, wherein the metal plugs are tungsten 4. A device of claim 3, wherein the plugs are covered by one or more dummy metal layer regions.

* * * * *